United States Patent [19]
Börnert et al.

[11] Patent Number: 5,755,666
[45] Date of Patent: May 26, 1998

[54] METHOD AND DEVICE FOR IMAGING A CURVED REGION BY MEANS OF MAGNETIC RESONANCE

[75] Inventors: Peter Börnert; Tobias Schäffter; Michael Harald Kuhn, all of Hamburg, Germany

[73] Assignee: U.S. Philips Corporation, New York, N.Y.

[21] Appl. No.: 683,992

[22] Filed: Jul. 19, 1996

[30] Foreign Application Priority Data

Jul. 20, 1995 [EP] European Pat. Off. ............ 95201999

[51] Int. Cl.[6] ................................................. A61B 5/055
[52] U.S. Cl. ............................................. 600/410; 324/309
[58] Field of Search ........................ 128/653.2; 324/307, 324/309, 312

[56] References Cited

U.S. PATENT DOCUMENTS

| | | |
|---|---|---|
| 4,678,996 | 7/1987 | Haacke et al. |
| 4,995,394 | 2/1991 | Cline et al. |
| 5,166,875 | 11/1992 | Machida . |
| 5,192,909 | 3/1993 | Hardy et al. ............... 324/309 |
| 5,252,923 | 10/1993 | Cottrell et al. |
| 5,327,884 | 7/1994 | Hardy et al. ............... 128/653.2 |
| 5,374,889 | 12/1994 | Leach et al. ............... 324/309 |
| 5,498,961 | 3/1996 | Kuhn et al. |
| 5,498,963 | 3/1996 | Schneider et al. |
| 5,532,595 | 7/1996 | Lampman et al. |
| 5,539,313 | 7/1996 | Meyer . |
| 5,548,216 | 8/1996 | Dumoulin et al. |
| 5,557,203 | 9/1996 | Nauerth . |
| 5,570,018 | 10/1996 | Halse . |
| 5,578,921 | 11/1996 | Morrell . |
| 5,623,206 | 4/1997 | McDonald et al. |

OTHER PUBLICATIONS

"New Spatial Localization Method Using Pulsed High-Pulsed High-Order Filed Gradients (Shot: Selection with High-Order Gradient)" By c.h. oh et al, Magnetic Resonance in Medicine, No. 18, pp. 63–70.

"The K-Trajectory Formulation of the NMR Imaging Proces with Applications in Analysis and Synthesis of Imaging Methods", by Donald B. Twieg, in Medical Physics, vol. 10, pp. 610–621.

"A Linear Class of Large–Tip–Angle Selective Excitation Pulses", by Pauly et al, in Journal of Magnetic Resonance, vol. 82, pp. 571–587.

Methods and Algorithms for Fourier–Transform Nuclear Magnetic Resonance Tomography, by Z.H. Cho et al, in Journal Optical Society, vol. 4, pp. 923–932.

"Wavelet–Encoded MR Imaging" by J.B. Weaver, in Magnetic Resonance in Medicine, No. 24, pp. 275–287.

*Primary Examiner*—Marvin M. Lateef
*Assistant Examiner*—Shawna J. Shaw
*Attorney, Agent, or Firm*—Jack D. Slobod

[57] ABSTRACT

A magnetic resonance method for imaging a curved portion of a body in which only MR signals in the curved portion of the body are generated by pulse sequences which include RF pulses and temporary magnetic fields. From the received MR signals an image of the curved portion can be reconstructed by use of linear transformations.

20 Claims, 7 Drawing Sheets

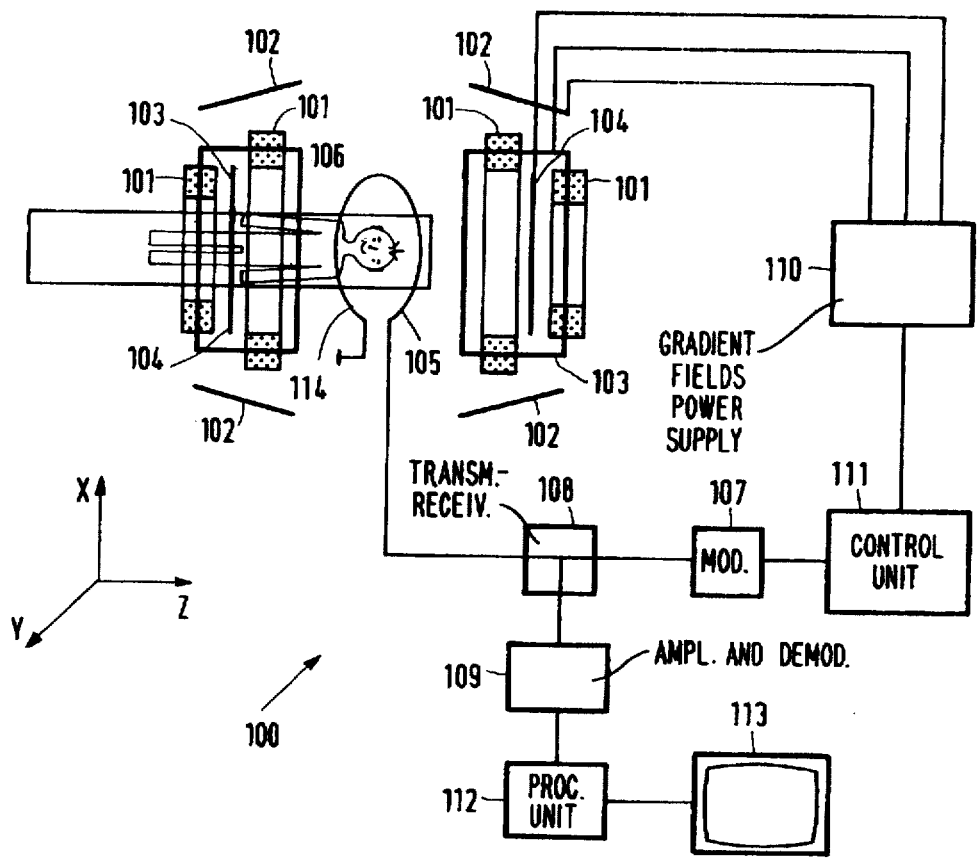
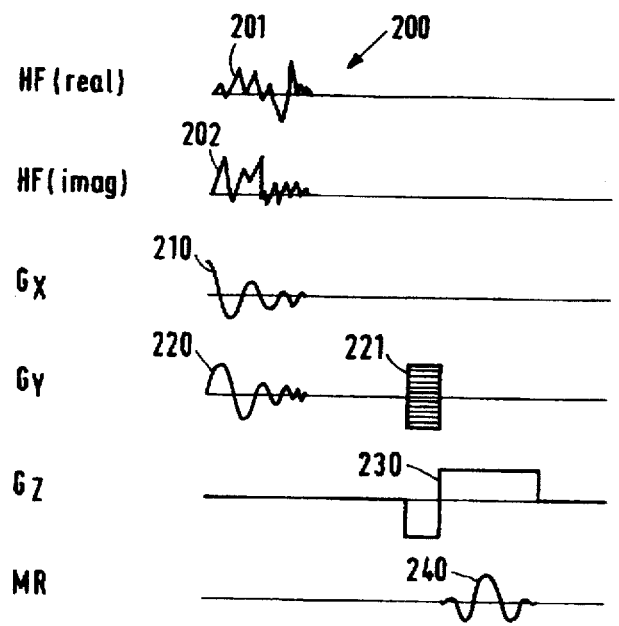
FIG.1
FIG.2

$$\begin{matrix} 1 & 1 & 1 & 1 & 1 & 1 & 1 & 1 \\ 1 & 1 & 1 & 1 & -1 & -1 & -1 & -1 \\ \sqrt{2} & \sqrt{2} & -\sqrt{2} & -\sqrt{2} & 0 & 0 & 0 & 0 \\ 0 & 0 & 0 & 0 & \sqrt{2} & \sqrt{2} & -\sqrt{2} & \sqrt{2} \\ \sqrt{2} & -\sqrt{2} & 0 & 0 & 0 & 0 & 0 & 0 \\ 0 & 0 & \sqrt{2} & -\sqrt{2} & 0 & 0 & 0 & 0 \\ 0 & 0 & 0 & 0 & \sqrt{2} & -\sqrt{2} & 0 & 0 \\ 0 & 0 & 0 & 0 & 0 & 0 & \sqrt{2} & -\sqrt{2} \end{matrix}$$

1

METHOD AND DEVICE FOR IMAGING A CURVED REGION BY MEANS OF MAGNETIC RESONANCE

BACKGROUND OF THE INVENTION

1. Field of the Invention

The invention relates to a method of imaging a portion of a body placed in a static magnetic field by means of magnetic resonance. The invention also relates to a device for carrying out such a method.

2. Description of the Related Art

The use of such a method is known in medical diagnostics for imaging a plane region which comprises the portion of the body. Magnetic resonance signals are generated in the region comprising the portion of the body by means of RF pulses and temporary magnetic gradient fields. After reception and sampling of these MR signals, a processing unit reconstructs an image of the portion of the body by means of, for example, a two-dimensional Fourier transform or a filtered backprojection. A disadvantage of the known method is that it is possible only to image plane regions of limited thickness of the body. Various structures in a human body, however, cannot be satisfactorily imaged by means of plane regions. To image such a structure, accordingly, the known method makes images of several adjacent plane regions, each comprising a portion of the structure. Subsequently, a complete image of the structure is composed from the various images of the individual portions. This method takes much time, while in addition there is a risk that the consecutive images of adjacent portions do not merge fluently into one another owing to movements of the patient. These disadvantages manifest themselves inter alia in imaging of structures such as blood vessels or the spinal column.

SUMMARY OF THE INVENTION

It is, inter alia, an object of the invention to offer a possibility of imaging such a structure directly, i.e. without making individual images of several plane regions which each comprise a portion of the structure. To achieve this object, the method according to the invention for imaging a portion of the body by magnetic resonance comprises the following steps:

a) the generation of MR signals in a region which is curved relative to isodynamic lines of the static magnetic field and which comprises the portion of the body, through the use of pulse sequences which comprise RF pulses and temporary linear magnetic gradient fields, whereby at the same time magnetic resonance characteristics of the portion of the body are encoded in the MR signals, b) reception and sampling of the generated MR signals, c) the reconstruction of an image of the portion of the body from the sampled MR signal values.

The crux of the invention lies in the recognition that the combination of the RF pulses and the temporary linear gradient fields may be so designed that MR signals are generated only within a region which comprises the curved portion. The term "isodynamic lines" denotes field lines of equal strength in the magnetic field, which field lines are used as a reference for determining the geometry of the region to be excited. The RF pulses used in combination with the temporary linear magnetic gradient fields for exciting the curved region are known per se from U.S. Pat. No. 5,192,909, where they are referred to as two-dimensional RF pulses or three-dimensional RF pulses. A 2DRF pulse in combination with suitable temporary magnetic gradient fields excites a region which is limited by two dimensions.

A 3DRF pulse in combination with suitable temporary magnetic gradient fields excites a region which is limited by three dimensions. It is possible through integration of the 2DRF or 3DRF pulses and the temporary linear magnetic gradient fields in known image pulse sequences to reconstruct an image of the curved portion directly from the received MR signals. The reconstructed image then is a projection of the portion on a plane defined by the gradient directions of two temporary magnetic gradient fields which are used in the image pulse sequences for phase and frequency encoding of the MR-signal.

It is remarked that from the article, "New Spatial localisation method using high order field gradient (SHOT: Selection with High-Order gradient)" by C.H. Oh et al., in Magnetic Resonance in Medicine, no 18, 1991, pp. 63–70, it is known to perform imaging of a curved portion by the use of temporary non-linear magnetic gradient fields and an RF pulse for exciting a curved region which comprises the relevant portion of the body. However, in that method the MR-apparatus comprises dedicated gradient coils for the generation of nonlinear gradient magnetic fields and also it is only possible to image a curved portion of a body with major limitations as to the shape and direction of the curved portion. An advantage of the method according to the present invention is that a usual MR device can be used without special adaptations of the gradient coils.

A further advantage of the method according to the invention is that it can also be used in an MR device in which it is not possible, owing to deviations in the generated magnetic fields, to excite a plane region in the body which is substantially perpendicular to the isodynamic lines. In such MR devices, a 2DRF pulse and suitable temporary magnetic gradient fields are used for exciting a plane region.

U.S. Pat. No. 5,192,909 cited above proposes a method of imaging a disc-shaped portion of a plane region of a body. To achieve this, the disc-shaped portion of the region only is selected through the inclusion of a 2DRF pulse in an imaging pulse sequence, so that MR signals are generated in the disc-shaped portion of the region only. In the method according to the present invention, however, it is not a disc-shaped portion of a plane region which is imaged, but a curved region, for example a cylinder wall. 2DRF pulses are also known from U.S. Pat. No. 5,327,884. In this Patent document, a magnetic resonance method is proposed for determining a temperature profile of tissue within a body by means of MR signals. In that method 2DRF pulses are used to excite the tissue within a cylinder in the body for the generation of MR signals. In the method according to the invention, by contrast, 2DRF or 3DRF pulses and temporary magnetic gradient fields are used for exciting a curved region which comprises the portion of the body, after which MR signals are generated by means of pulse sequences and an image of the portion of the body is reconstructed therefrom.

An embodiment of the method according to the invention is further characterized by the following steps:

a) the repeated generation and sampling of MR signals for a plurality of images of the portion to be imaged, magnetic resonance characteristics of the portion of the body being included in the MR signals in encoded form for consecutive images;

b) the determination of images by means of a linear transform of linear combinations of the sampled MR signal values, or by means of linear combinations of linear transforms of the sampled MR signal values.

The linear transform is, inter alia, a Fourier transform, a Hadamard transform, a wavelet transform or filtered backprojection. During imaging of a strongly curved portion artifacts could arise in those regions whose projections coincide on a plane which is defined by the gradient directions of two temporary magnetic gradient fields used for phase and frequency encoding of the MR-signal. The artefacts manifest themselves as an increased intensity and loss of resolution. The individual contributions to the MR signals of these regions are determined for counteracting these artefacts. For this purpose, the portion to be imaged is subdivided into first and second sub-portions. A priori knowledge of the geometry of the portion to be imaged is used for the subdivision into first and second subportions. The received MR signals can be separated into contributions originating from the first and from the second sub-portions in that the nuclear spin magnetizations of the first and second sub-portions are provided with different amplitude or phase. Encoding of the amplitude and phase of the nuclear spin magnetizations is provided by means of 2DRF or 3DRF pulses and temporary magnetic gradient fields for the implementation of the separate pulse sequences for consecutive images. The nuclear spin magnetizations of the first and second sub-portions are provided with a first encoding by means of a first 2DRF pulse and temporary magnetic gradient fields for generating a first series of MR signals, and for generating a second series of MR signals the nuclear spin magnetizations of the first and second sub-portions are given a second encoding by means of a second 2DRF pulse and temporary magnetic gradient fields.

The method according to the invention may be further characterized in that the scheme used for the encoding is a linear transformation scheme, and the coefficients of the linear combinations are determined by the chosen scheme.

The encoding of first and second sub-portions in the generation of the first series of MR signals and the second series of MR signals for determining a first image of the first sub-portions and a second image of the second sub-portions is defined by a linear transformation scheme.

The method according to the invention may be further characterized in that the linear transformation scheme is a Fourier scheme, a Hadamard scheme or a wavelet scheme. When the Fourier scheme, the Hadamard scheme or the wavelet scheme is used, a first image of the first sub-portions can be reconstructed from the sum of MR signals of the first and the second series belonging to corresponding lines in the k-space by means of, for example, a two-dimensional Fourier transform after reception of the first and the second series of MR signals. And a second image of the second sub-portions can be reconstructed by means of the two-dimensional Fourier transform from the difference of the MR signals of the first and second series which belong to corresponding lines in the k-space. The separation of image information into a first image of the first sub-portions and a second image of the second sub-portions may also be carried out after the Fourier transform because the Fourier transform is a linear transform.

The description of the k-space is known inter alia from the article "The k-trajectory formulation of the NMR imaging process with applications in analysis and synthesis of imaging methods", Med. Phys., vol. 10, 1983, pp. 610–621. Sampling of MR signals and processing of the MR-signals from a slice of the object into an image can be described in terms of the k-space, so that the frequency and phase of the MR signal are coupled to a position in the object via the strength of the magnetic gradient fields. The location of the sampled value in relation to the origin of the k-space is defined by the time integral of the temporary magnetic gradient fields present before and during sampling of the MR signal. In conventional notation, the $k_x$-axis of the k-space corresponds to the frequency of the MR signal, and the $k_y$-axis to the phase of the MR signal.

The method according to the invention may further be characterized in that it further comprises a stretching operation in which operation a linear axis is mapped along a stretched axis. The linear axis is associated with a position in the gradient direction of the temporary magnetic gradient field used for the phase encoding or frequency encoding of the MR-signal and the stretched axis is associated with a position along the curved portion. By using this stretching operation the image is transformed so that a loss of resolution of the image of the curved portion can be counteracted by the use of the stretched axis.

The method according to the invention may further be characterized in that it further comprises the following steps:
a) the determination of a correction mask from a shape of the curved portion of the body;
b) the correction of the intensity of an image of the curved portion by means of the correction mask. Undesirable intensity variations also arise during imaging of a curved portion. The intensity variations arise because the MR signal results from a projection of the nuclear spin magnetization of the curved portion on a plane which is defined by the gradient directions of the temporary magnetic gradient fields for the application of a phase and a frequency in the MR signal. To counteract these intensity variations, a correction mask is determined from the geometrical shape of the curved portion, with which correction mask the image is corrected.

Another method according to the invention which uses 2DRF pulses for imaging a portion of a body is characterized in that it further comprises the following steps:
a) the subdivision of the portion of the body into several sub-portions,
b) the repeated generation of MR signals in the sub-portions by means of the RF pulses and temporary magnetic gradient fields, the magnetic resonance characteristics of each sub-portion being encoded in the MR signals in accordance with an encoding scheme,
c) the reconstruction of the image of the portion by means of an inverse transform of the chosen encoding scheme of the sampled MR signal values and one-dimensional Fourier transforms.

The curved portion is subdivided into the sub-portions along a curved line on the basis of a priori knowledge. The curved line forms part of the curved portion and lies in a plane perpendicular to the gradient direction of the temporary magnetic gradient field for the MR signal frequency encoding. The number of sub-portions is determined by the desired resolution of the image along the line. This number at the same time determines the smallest number of MR signals which is to be generated for reconstructing an image. Subsequently, the nuclear spin magnetization of consecutive sub-portions of the curved portion is encoded by means of the 2DRF pulses and the temporary magnetic gradient fields. Then an MR signal is generated by means of a pulse sequence. After generation, reception, and sampling of the number of MR signals, an image of the curved portion can be reconstructed in that first the separate contributions of the sub-portions are determined by means of an inverse transform of the sampled MR signals, and then an image is determined by means of one-dimensional Fourier transforms of the individual contributions of sub-portions. One dimension of the reconstructed image is then formed by the gradient direction of the temporary magnetic gradient field which is used for providing the frequency encoding in the MR signal and the other dimension is formed by a stretched version of the curved line, along which stretched line the positions of the sub-portions along the curved line are arranged. A difference with a known method of imaging straight slices, for example Echo Planar Imaging, is that first the entire straight slice of the object is excited in consecutive imaging pulse sequences in the Echo Planar Imaging (EPI) method, after which the transverse nuclear spin magnetizations of the sub-portions of the straight slice are provided with different phase codes by means of a temporary magnetic gradient field. Then an MR signal is generated with a temporary magnetic gradient field. In the method according to the invention, by contrast, the sub-portions of the curved portion are provided with codes for the transverse nuclear spin magnetization in consecutive imaging pulse sequences by means of a 2DRF pulse and temporary magnetic gradient fields, after which an MR signal is generated by means of a temporary magnetic gradient field.

The method according to the invention may be further characterized in that the encoding scheme used is a linear transformation scheme.

Various encoding schemes are possible for the consecutive MR signals. The individual contributions of the sub-portions are determined by means of the inverse transforms on the basis of the chosen encoding scheme, after which an image of the curved portion is reconstructed by means of the 1D Fourier transforms of the individual contributions.

The method according to the invention may be further characterized in that the encoding scheme used is a Fourier scheme, a Hadamard scheme or a wavelet scheme. The advantage of the use of the Hadamard scheme or the wavelet scheme over the Fourier scheme is that the reduction of the field of view to the dimensions of the curved portion can take place without strong artefacts caused by the Gibbs effect. These artifacts may occur if a limited number of points have to be Fourier transformed. This effect is rather dramatic in the vicinity of edges. Other linear transformation schemes which may be used are, e.g. cosine transforms and sine transforms.

The method according to the invention may also be characterized in that in the generation of MR signals a pulse sequence is used which also comprises RF pulses and temporary magnetic gradient fields for suppressing a contribution to the MR signals from a substance inherent in the body itself. Undesirable components in the MR signals caused by the presence of, for example, fat in the tissues can be suppressed by this measure. A suitable RF pulse for this is a 180° RF pulse which is radiated chemically selectively, whereby the transverse nuclear spin magnetization of water only is refocused.

An MR device for imaging a portion of a body in accordance with the invention is characterized in that the control unit is designed for carrying out the following steps:
1) the generation of MR signals by means of pulse sequences which comprise 2DRF pulses and temporary magnetic gradient fields for exciting a region which is curved relative to the isodynamic lines of the static magnetic field and which comprises the portion of the body;
2) reception and sampling of MR signals;
3) the reconstruction of an image of the portion of the body from the sampled MR signals.

The above and other, more detailed aspects of the invention will be explained by way of example with reference to the drawing.

BRIEF DESCRIPTION OF THE DRAWING

The drawing comprises the following Figures:
FIG. 1 showing an MR device for imaging objects,
FIG. 2 showing a 2DRF pulse with temporary magnetic gradient fields in the x- and y-directions, FIG. 3 showing two portions of a cross-section of a cylinder, FIG. 4 showing consecutive phases of an image reconstruction process, FIG. 5 showing an intensity profile of a curved portion, FIG. 6 showing a strongly curved portion with a subdivision into first and second sub-portions, FIG. 7 showing the reconstruction of a strongly curved portion, FIG. 8 showing a result of a stretching operation, FIG. 9 showing an intensity profile for determining a correction, FIG. 10 showing a curved portion along the line S, FIG. 11 showing a 2DRF pulse sequence, FIG. 12 showing a Hadamard encoding profile, FIG. 13 showing a wavelet encoding profile, FIG. 14 showing a Hadamard encoding scheme, FIG. 15 showing a wavelet encoding scheme, and FIG. 16 showing a 2DRF pulse sequence integrated with a fat suppression pulse.

DETAILED DESCRIPTION OF THE PREFERRED EMBODIMENTS

Figure 3:
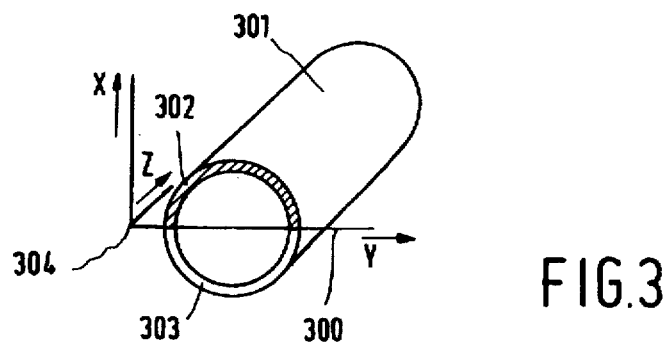

FIG. 1 shows a magnetic resonance device which is known per se. The MR device 100 comprises a first magnet system 101 for generating a static magnetic field, a second magnet system 102, 103, 104 for generating temporary magnetic gradient fields with gradient directions in three orthogonal directions, and power supply units 110 for the second magnet system 102, 103, 104. The supply for the first magnet system 101 is not drawn. The system comprises a diagnostic space which is large enough for accommodating a portion of a body 106 to be diagnosed. As is usual, the direction of the static magnetic field is designated the z-direction of the system of coordinates shown in FIG. 1. A RF transmitter coil 105 serves for generating RF fields and is connected to a RF source and modulator 107. The RF transmitter coil 105 is applied around or against or adjacent a portion of the body inside the diagnostic space. A receiver coil 114 is used for receiving a magnetic resonance signal. This may be the same coil as the RF transmitter coil 105. The RF transmitter-receiver coil 105 is connected to a signal amplifier and demodulation unit 109 via a transmitter-receiver circuit 108. A sampled phase and a sampled amplitude are derived from the received MR signals in the signal amplifier and demodulation unit 109. Then the sampled phase and sampled amplitude are supplied to a processing unit 112. The processing unit 112 processes the offered phase and amplitude into an image by means of, for example, a two-dimensional Fourier transform. This image is displayed on a monitor 113. The magnetic resonance device 100 is also provided with a control unit 111. The control unit 111 generates control signals for the RF transmitter 107, the supply units 110, and the processing unit 112.

When the magnetic resonance device is switched on with the body 106 arranged in the magnetic field, a small majority of nuclear spins in the body is aligned with the direction of the magnetic field. In the equilibrium state this leads to a net magnetization $M_0$ of the material of the body 106 which is parallel to the direction of the magnetic field. This macroscopic magnetization $M_0$ can be changed by subjecting the body 106 to RF pulses which have a frequency equal to the Larmor frequency of the nuclear spins. The nuclear spins are excited thereby, and the direction of the magnetization $M_o$ changes. When the body is irradiated with suitable RF pulses, a rotation of the macroscopic magnetization vector is obtained, the angle of which rotation is called flip angle. The resonance frequency and the magnetization are locally influenced by the introduction of changes in the magnetic field through the application of temporary magnetic gradient fields. The use of suitably chosen pulse sequences, comprising RF pulses and temporary magnetic gradient fields, calls up MR signals in the body. The MR signals provide information on certain kinds of nuclei, for example, hydrogen nuclei and the substance containing these hydrogen nuclei. Information on internal body structures becomes available through analysis of the MR signals and a presentation thereof in the form of images. A fuller description of magnetic resonance images and magnetic resonance information can be found in the book "Practical NMR Imaging", by M. A. Foster and J. M. S. Hutchison, 1987, IRL Press.

FIG. 2 shows an example of a 2DRF pulse with temporary magnetic gradient fields used in a method according to the invention. The 2DRF pulse comprises a magnitude waveform 201 and an phase waveform 202. The 2DRF pulse is used in combination with a first temporary linear magnetic gradient field 210 with a gradient direction in the x-direction and a second temporary linear magnetic gradient field 220 with a gradient direction in the y-direction for the excitation and application of a phase in the transverse nuclear spin magnetization of the region which comprises a curved portion of the body 106. The complex waveform of the 2DRF pulse can be determined by, for example, scanning along a spiral trajectory in k-space of a Fourier transform of a geometrical shape of the curved portion, whereby the magnitude and the phase of the 2DRF pulse at a distinct time are equal to the magnitude and phase of the Fourier transform of the geometrical shape at a position along the spiral trajectory, which position corresponds with that time. The position in k-space at a distinct time t is given by $$k_x = \int_0^t \gamma G_x dt \tag{1}$$

$$k_y = \int_0^t \gamma G_y dt \tag{2}$$

For further knowledge on the creation of 2DRF and 3DRF pulses a reference is made to the article "A Linear Class of Large-Tip-Angle Selective Excitation Pulses", by J. Pauli et al., Journal of Magnetic Resonance, 82, 571–587, 1989.

The spiral trajectory is generated by the waveform of the first temporary magnetic gradient field 210 and the waveform of the second temporary magnetic gradient field 220. Eddy currents are counteracted in that the first and second temporary magnetic gradient fields 210, 220 could be chosen, by example, that the strength of the first temporary magnetic gradient field 210 and the strength of the second temporary magnetic gradient field 220 trace a spiralling path in the k-space with a constant angular velocity during the presence of the 2DRF pulse. In addition, a 2DRF pulse then arises which is self-refocusing and linear. Furthermore, the 2DRF pulse 201 is integrated in an imaging pulse sequence. The imaging pulse sequence comprises a third temporary magnetic gradient field 221 with a gradient direction in the y-direction for providing phase encoding and a fourth temporary magnetic gradient field 230 with a gradient direction in the z-direction for generating an MR signal 240 and providing a frequency encoding in the MR signal. An embodiment of the invention for imaging a curved portion is elucidated with reference to FIG. 3, which shows a two-dimensional example.

FIG. 3 shows a cross-section of a curved region formed by the wall of the cylinder 300 and comprising a portion of the body 106. The longitudinal direction of the cylinder 300 is parallel to the z-axis here, by way of example. The cylinder wall 301 comprises the region of the body which is selectively excited by means of, for example, a 2DRF pulse followed by an imaging pulse sequence as described in the description of FIG. 2. The sampled MR signal now contains contributions from the transverse nuclear spin magnetization of both the first portion 302 and the second portion 303 of the cylinder wall 301; since the projection of the first portion 302 on the y,z-plane coincides with the projection of the second portion 303 on the y,z-plane, it is not possible to determine the individual contributions from the portions 302, 303. If the 2DRF-pulse is shaped to excite the nuclear spins in a cylinder 300 comprising the surface of the heart muscle, then the blood vessels of the heart muscle in that cylinder are projected on the Y–Z-plane and an MR-angiogram can be obtained. It does not matter that the blood vessels located onto the heart muscle, are projected on a single plane, because the medical specialist is used to that in angiographic examinations. However, in other examinations it may required to determine the individual contributions to the MR signal of the first portion 302 and the second portion 303. For determining the individual contributions to the MR signals from the first portion 302 and the second portion 303, the method according to the invention generates in a first experiment a first sequence of MR signals and in a second experiment a second sequence of MR signals, wherein an encoding of the transverse nuclear spin magnetizations in the two portions 302, 303 is applied in both experiment through the use of 2DRF pulses and suitably chosen temporary magnetic gradient fields in generating the MR signals. A transverse nuclear spin magnetization with a first encoding is provided in both portions 302, 303 for generating the first sequence of MR signals. A transverse nuclear spin magnetization with a second encoding is provided in both portions 302, 303 for generating a second sequence of MR signals. The first encoding is chosen such that the phase of the transverse magnetization of the first portion 302 is equal to the phase of the transverse nuclear spin magnetization of the second portion 303. The second encoding is chosen such that the phase of the transverse nuclear spin magnetization of the first portion 302 is the opposite of the phase of the transverse nuclear spin magnetization of the second portion 303. The generated MR signals are received and sampled in the demodulation unit 109. Then a reconstruction is carried out in the processing unit 112. This reconstruction could be based on, for example, a 2D Fourier transform, but filtered backprojection or other linear transforms are also possible reconstruction techniques. The monitor 113 displays the reconstructed image. The reconstruction of the image of the first portion 302 and of the second portion 303 is elucidated with reference to FIG. 4.

Figure 4:
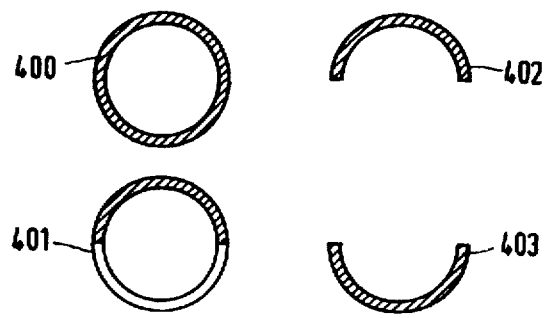

FIG. 4 shows a first cross-section 400 of a cylinder wall in the x-y plane. When the cylinder wall is imaged as a projection image in the y-z plane, the MR signals originating from a first portion with a cross-section 402 and a second portion with a cross-section 403 will be undistinguishable in the projection image. According to a method of the invention in a first experiment a first dataset $S_1(i,j)$ of the cylinder wall is generated by using a first appropriate 2DRF pulse and a suitable chosen temporary gradient field and in a second experiment a second dataset $S_2(i,j)$ is generated by a second appropriate 2DRF pulse and suitably chosen temporary gradient field. In both experiments the cylinder wall nuclear spin magnetization is excited, however in the second experiment a phase difference of 180° is introduced by the second 2DRF pulse between MR-signals originating from the first portion with the cross-section 402 and MR-signals originating from the second portion with the cross-section 403. The encoding of a first portion is visualised by the cross-section 401 of the cylinder wall, in which cross-section the nuclear spin magnetization of the marked portion has a phase difference of 180° with the magnetization of the unmarked portion. Then a first image $I_1(i,j)$ of the first portion with a cross-section 402 and a second image $I_2(i,j)$ of the second portion with a cross-section 403 are determined as follows:

$$I_1(i,j)=S_1(i,j)+S_2(i,j) \quad (3)$$

$$I_2(i,j)=S_1(i,j)-S_2(i,j) \quad (4)$$

The coefficients 1,1 of the first equation (3) and the coefficients 1,−1 of the second equation (4) correspond to the coefficients of, inter alia, a 2×2 Fourier matrix, a 2×2 Hadamard matrix or a 2×2 wavelet matrix. Both reconstructed images $I_1(i,j)$ and $I_2(i,j)$ are projections of, respectively, the first portion and the second portion of the cylinder wall on the plane defined by the y,z axis.

Figure 5:
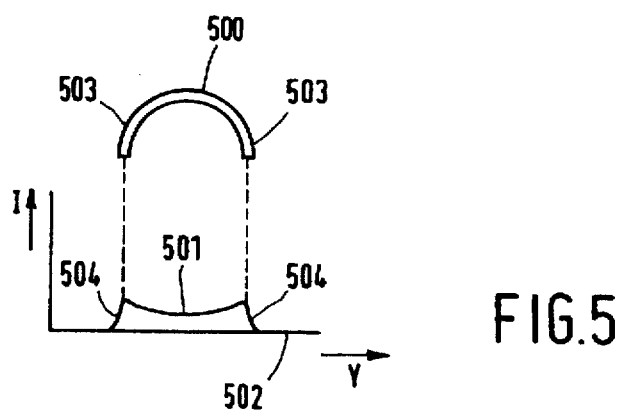

With some modification, the method may also be used for counteracting intensity variations and loss of resolution which arise in imaging of strongly curved portions. This method is explained further with reference to FIGS. 5, 6 and 7. Intensity profiles of the images are used instead of two-dimensional images for illustrative reasons in the explanation of the method. FIG. 5 shows an intensity profile 501 of an image of a curved portion of a cylinder wall with a cross-section 500. The intensity profile 501 is a projection of the cross-section 500 of the cylinder wall on the line 502 which forms part of the y,z-plane. As a result, the ends 503 are imaged with an increased intensity 504 and a loss of resolution.

Figure 6:
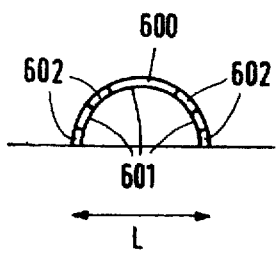
Figure 7:
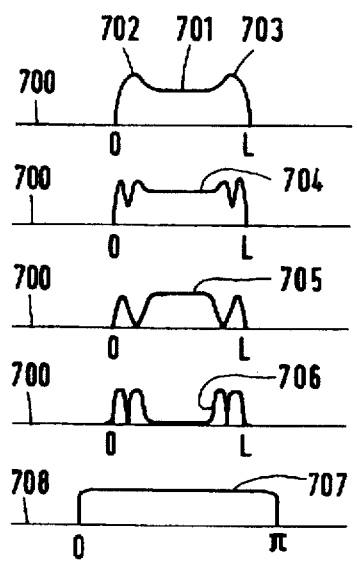
Figure 8:
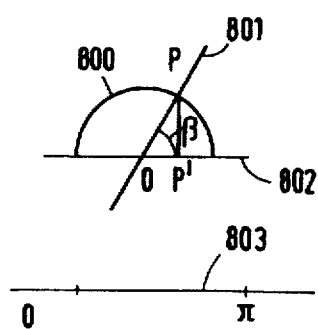

In a method according to the invention, this intensity change and loss of resolution is counteracted in that the cross-section 500 is subdivided into a number of first and second sub-portions, the size of the sub-portions being so chosen on the basis of a priori knowledge of the cross-section 500 of the curved portion and the gradient directions of the imaging gradient fields to be applied, that the size of the sub-portions decreases in regions of the cross-section of the curved portion where intensity changes may be expected. The a priori knowledge can, for example, be obtained by a fast, conventional, low resolution image. Subsequently, in two experiments a first sequence and a second sequence of MR signals are generated, an encoding of the transverse nuclear spin magnetization in the subportions being provided through the use of 2DRF pulses and suitably chosen temporary magnetic gradient fields in the generation of the MR signals. In the first experiment the transverse nuclear spin magnetization of the first and second sub-portions have the same phase in the generation of the first sequence of MR signals. In the second experiment a the transverse nuclear spin magnetization of the first and the second sub-portions have a phase difference of 180° in the generation of the MR-signals. FIG. 6 shows a cross-section 600 with first sub-portions 601 and second sub-portions 602. The determination of the nuclear spin magnetization of the first sub-portions 601 and the second sub-portions 602 from the received first and second sequences of MR signals is explained with relation to FIG. 7. FIG. 7 shows a first intensity profile 701 of the cross-section 600 along a first axis 700. The first intensity profile 701 is reconstructed from the first sequence of MR signals, which first intensity profile shows increased intensities and a loss of resolution at a first end 702 and a second end 703. A second intensity profile 704 of the same cross-section 600 is reconstructed from the second sequence of MR signals. A third intensity profile 705 of the first subportions 601 is formed by the sum of the first intensity profile 701 and the second intensity profile 704. Similarly, a fourth intensity profile 706 of the second sub-portions 602 is formed by the difference between the first intensity profile 701 and the second intensity profile 704. The fifth intensity profile 707 of the fully reconstructed cross-section 600, in which the intensity changes have been suppressed and the resolution at the ends is increased, is obtained by the combination of a stretched version of the third intensity profile 705 of the first sub-portions 601 and a stretched version of the fourth intensity profile 706 of the second sub-portions 602. The stretching operation maps a position along the axis 700 into a position along a stretched axis 708 in FIG. 7 of the stretched intensity profile 707. This stretching operation is based on the knowledge of the position of a sub-portion along the cross section 600 and its corresponding position along an axis 708 of the intensity profile 707. This stretching operation can be determined by, for example, a Riemann transformation. FIG. 8 shows a result of the stretching operation, wherein a position along a first axis 802 is transformed into a position along a second axis 803. The result of the stretching operation is that a projection P' of a point P along the curve line 800 on the first axis 802 corresponds to an angle β of a radial line 801 through the origin O and the position P that crosses the first axis 802, which value of β is mapped into an interval <0,π> at the second axis 803. Subsequently, the image of the curved portion of the cylinder wall will have one axis that will correspond with the curve length.

Figure 9:
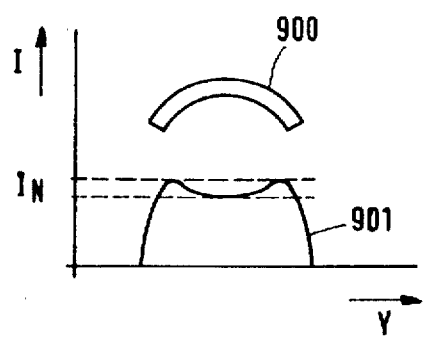

Yet other intensity variations may arise in an image of a less strongly curved portion. These intensity variations arise because the MR signal is determined by a projection of the nuclear spin magnetization of the curved portion on a plane which is defined by the gradient directions of the phase and frequency temporary magnetic gradient fields. The correction of these intensity variations can be performed by another method according to the invention, which method is explained with reference to FIG. 9. FIG. 9 shows a cross-section 900 of the curved portion and an intensity profile 901, corresponding to the projection of the cross-section of the curved portion on the plane y–z. A correction function $F_c(y)$ is determined from the curved shape which pictures each point of the intensity profile 901 at a constant value $I_n$. Extension of the method to two dimensions means that a correction mask $F_c(k,l)$ is derived from a curved portion. This correction mask $F_c(k,l)$ brings the value of a pixel $I_{k,l}$ of a reference image $I_1(k,l)$ to a constant value $I_n$ through multiplication by a value $F_c(k,l)$ of a corresponding pixel of the correction mask $F_c(k,l)$. A corrected image $I_c(k,l)$ is now determined in that each pixel $I(k,l)$ of an image $I_i(k,l)$ of the curved portion is multiplied by a value $F_c(k,l)$ of the correction mask $F_c(k,l)$ in the processing unit 112. This method may also be combined with the methods described in the descriptions of FIGS. 4,5,6,7 and 10.

Figure 10:
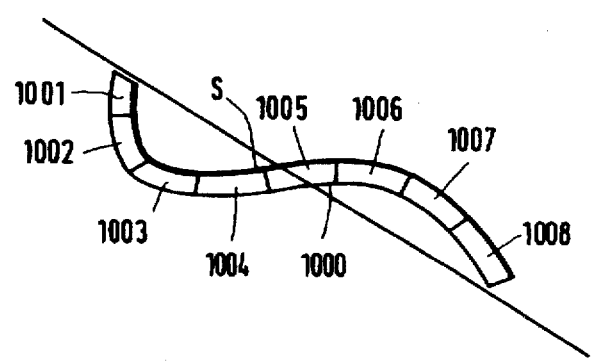
Figure 11:
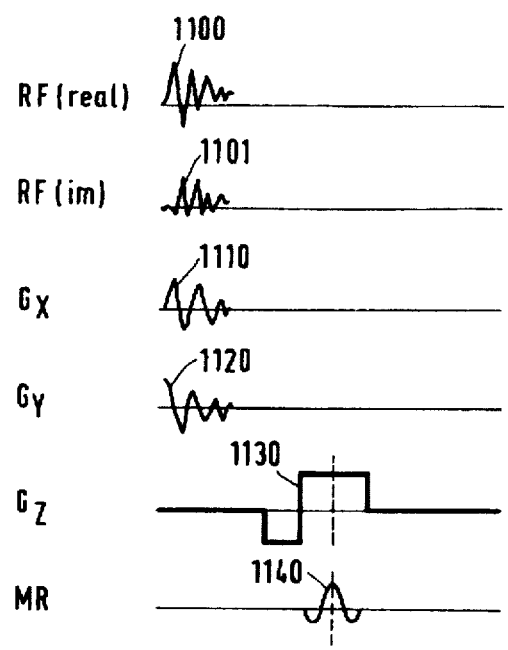

A second method according to the invention for imaging a curved portion of an object placed in the static magnetic field of the MR device is explained with reference to FIG. 10. FIG. 10 shows by way of example a cross-section 1000 in the x,y-plane of a curved portion. The curved portion is subdivided into a number of sub-portions on the basis of a priori knowledge for obtaining an image containing m×n pixels, for example into eight preferably elongate sub-portions 1001, 1002, . . . , 1008. The number of sub-portions in the present description is limited to 8 to keep the illustration manageable. In practice, the number of sub-portions lies, for example, between 16 and 128. The other number n defining the number of pixels within a sub-portion lies, for example, between 16 and 256. The eight sub-portions 1001, 1002, . . . , 1008 lie along the line S. The longitudinal direction (not indicated) lies in the z-direction, perpendicular to the plane of the paper. The control unit 111 generates control signals for providing pulse sequences for the generation of the MR signals. The transverse nuclear spin magnetizations of the sub-portions are encoded through integration of a 2DRF pulse and of temporary linear magnetic gradient fields into the pulse sequences for the separation of the contributions from the sub-portions to the MR signals. This means that MR signals are generated only in a region which comprises the curved portion of the body 106. FIG. 11 shows an example of a pulse sequence for generating an MR signal 1140 with an encoding of the nuclear spin magnetizations of the individual subportions 1001, 1002, . . . , 1008. The encodings of the nuclear spin magnetizations of the individual portions are provided by means of 2DRF pulses, and by means of a first temporary linear magnetic gradient field 1110 with a gradient direction in the x-direction, and by means of a second temporary linear magnetic gradient field 1120 with a gradient direction in the y-direction. The complex waveform of the 2DRF pulse consists of a magnitude waveform 1100 and an phase waveform 1101. The magnitude waveform and the phase waveform of the 2DRF pulses and the first temporary magnetic gradient fields 1110 and the second temporary gradient field 1120 are calculated from the shape of the curve and the encoding to be provided. The sensitivity of the 2DRF pulse to $B_0$, effects and/or chemical shifts can be minimized in the determination of the waveform of the 2DRF pulse. Subsequently, an MR signal 1140 is generated by means of a third temporary magnetic gradient field 1130 with a gradient direction in the z-direction. The generated MR signals are received in the demodulation unit 109. A reconstruction of the image from the sampled MR signals is carried out in the processing unit 112. The monitor 113 shows the reconstructed image of the curved portion.

To provide an image containing m×n pixels of a curved portion of the body, m MR signals are generated using m 2DRF pulses with m different encodings for the transverse nuclear spin magnetizations of the m sub-portions, each MR signal being sampled in n samples. The received and sampled $j^{th}$ MR signal $M_j(t)$ then is the $j^{th}$ summed signal of the contributions from m sub-portions. After the m pulse sequences with m 2D RF pulses have been completed, m different sum signals are available which may be represented by the matrix:

$$M^m(t) = \begin{pmatrix} M_1 \\ M_2 \\ \cdot \\ M_j \\ \cdot \\ M_m \end{pmatrix} \quad (5)$$

Equation (5) may be rewritten in terms of signals $S_m(t)$ originating from the individual subportions as:

$$M^m(t) = E_{mm} S^m(t) \quad (6)$$

in which:

$$S^m(t) = \begin{pmatrix} S_1(t) \\ S_2(t) \\ \cdot \\ S_k(t) \\ \cdot \\ S_m(t) \end{pmatrix} \quad (7)$$

and the encoding matrix $E_{mm}$ is represented by $$E_{mm} = \begin{pmatrix} e_{11} & e_{12} & \cdot & e_{1k} & \cdot & e_{1m} \\ e_{21} & e_{22} & \cdot & e_{2k} & \cdot & e_{2m} \\ \cdot & \cdot & \cdot & \cdot & \cdot & \cdot \\ e_{j1} & e_{j2} & \cdot & e_{jk} & \cdot & e_{jm} \\ \cdot & \cdot & \cdot & \cdot & \cdot & \cdot \\ e_{m1} & e_{m2} & \cdot & e_{mk} & \cdot & e_{mm} \end{pmatrix} \quad (8)$$

in which $|e_{jk}| \leq 1$ for $1 \leq j, k \leq m$. The encoding matrix $E_{mm}$ is a non-singular m×m matrix. The matrix of individual MR signals $S_m$ may now be determined from the inverse value of E and the equation $S^m = E_{mm}^{-1} M^m(t)$, in which $E^{-1}_{mm}$ represents the decoding matrix.

A number of linear encoding matrices may be used, e.g. Fourier, Hadamard, sine and cosine transform, and wavelet transforms. The Fourier, Hadamard, and sine and cosine transforms are explained in the article "Methods and algorithms for Fourier transform nuclear magnetic resonance tomography" by Z. H. Cho et al., in Journal Optical Society America. A4, 923–932, 1989. Wavelet encoding is explained in the article "Wavelet-encoding MR imaging" by J. B. Weaver, in Magnetic Resonance in Medicine, no. 24, 1992, pp. 265–287. An example of consecutive encodings of the nuclear spin magnetizations of the sub-portions belonging to the Hadamard encoding and wavelet encoding is given in FIG. 12 and FIG. 13.

Figure 12:
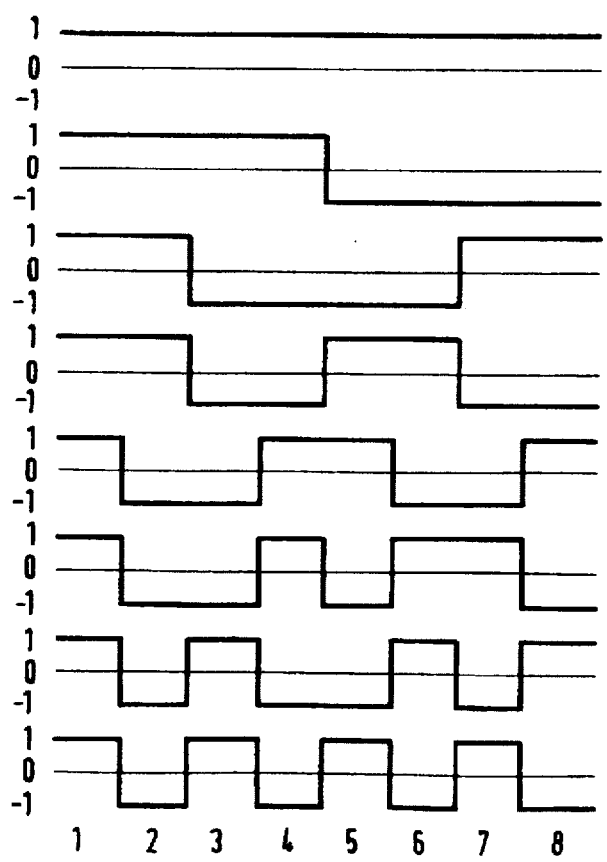
Figures 13, 14:
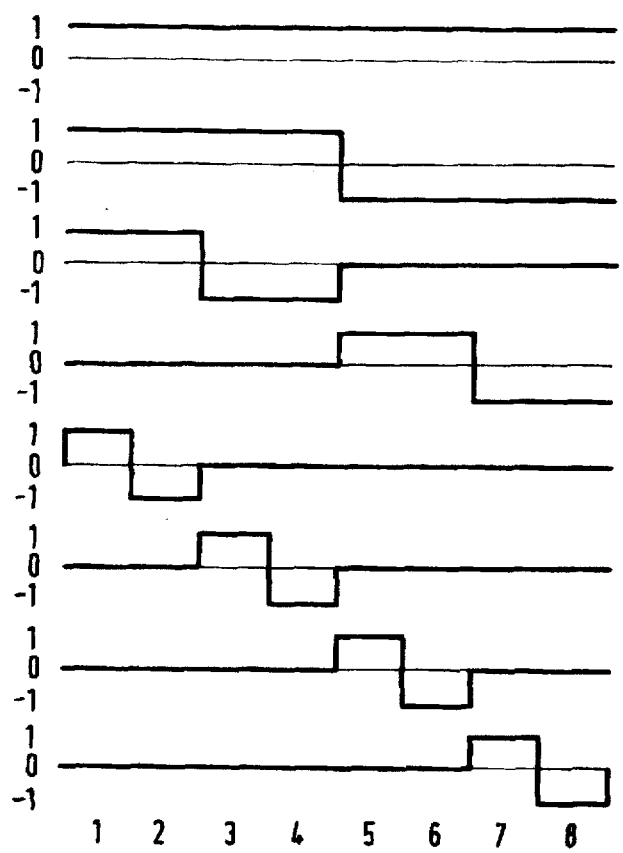
Figures 15, 16:
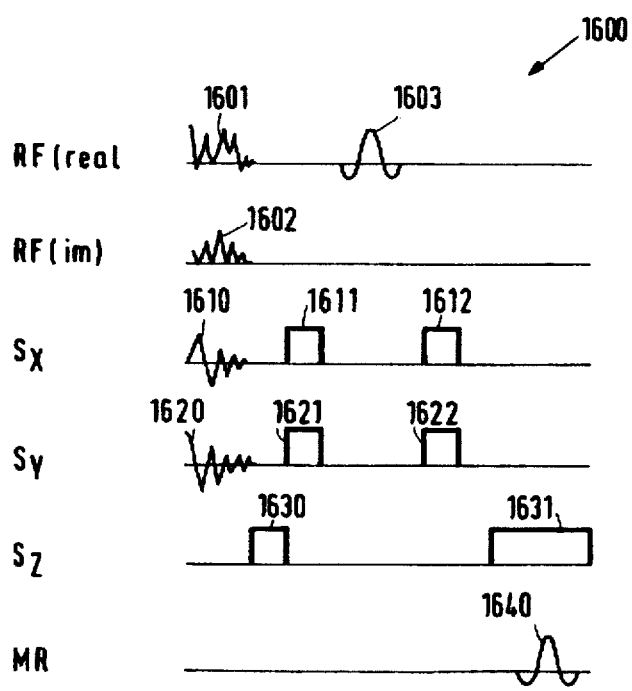

FIG. 12 shows a sequence of consecutive excitation profiles of the eight sub-portions for eight consecutive pulse sequences in a Hadamard code. FIG. 13 shows a sequence of consecutive excitation profiles of the eight sub-portions for eight consecutive pulse sequences in the wavelet code. Eight MR signals are generated with the eight pulses in both examples. In practice, a greater number of sub-portions will be used instead of eight sub-portions, for example, a number between 16 and 64. The 1 and −1 indicated in FIGS. 14 and 15 represent nuclear spin magnetization phases of +180° and −180°. The Hadamard encoding coefficients, furthermore, are the coefficients of the encoding matrix of FIG. 14. The wavelet encoding coefficients are given in FIG. 15. An image of the sub-portions is obtained through an inverse transform of the sampled MR signals on the basis of the encoding diagram used, followed by one-dimensional Fourier transforms of the individual contributions from the sub-portions. The dimensions of the reconstructed image are defined by a line with the length of the curved line S, on which line the positions of each sub-portion are arranged and the z-direction. In this embodiment of the method, an imaging pulse sequence is used wherein an MR signal is generated by means of a temporary magnetic gradient field. The method according to the invention, however, may also be used in combination with other imaging pulse sequences such as a spin echo, where an MR signal is generated by means of a refocusing RF pulse.

A chemically-selective 180° RF pulse may be integrated into an imaging pulse sequence for exciting a curved region for the purpose of suppressing the contribution of, for example, fat to the MR signal of a curved portion of the body. FIG. 16 shows an integrated pulse sequence 1600. A region comprising a portion of the body is excited by means of a set of 2DRF pulses, each of the 2DRF pulses comprises a magnitude waveform 1601 and a phase waveform 1602, in combination with a first temporary magnetic gradient field 1610 with a gradient direction in the x-direction, and a second temporary magnetic gradient field 1620 with a gradient direction in the y-direction. Then a third, dephasing temporary magnetic gradient field 1630 with a gradient direction in the z-direction is applied. A 180° RF pulse 1603 is then chemically-selectively introduced, so that the nuclear spins of hydrogen only present in the structure are refocused. To prevent a breakthrough of a free induction decay signal a fourth temporary magnetic gradient field 1611 and a fifth temporary magnetic gradient field 1612, both with gradient directions in the x-direction, and a sixth temporary magnetic gradient field 1621 and a seventh temporary magnetic gradient field 1622, both with gradient directions in the y-direction, are symmetrically provided before and after the chemically-selective 180° RF pulse 1603. Further an MR signal 1640 is generated by means of an eighth temporary magnetic gradient field 1631 with a gradient direction in the z-direction. A breakthrough of a free induction decay may result from an imperfect refocussing pulse. The refocussing pulse may not be perfect due to various reasons, e.g. $B_1$-field inhomogeneities, frequency response of the refocussing pulse itself. Therefore it also generates a new transversal magnetization, which magnetization was not present prior to the refocussing pulse. The signal generated by this new transverse magnetization is also called Free Induction Decay (FID) signal. This FID signal don't comprise any signal encoding and is superimposed on the echo signal and will lead to image artifacts. So in other words the FID signal breaks into the acquisition window. By the application of the symmetrical gradient pulses the FID signal will be substantially reduced, but the dephasing effects of the symmetrical gradient pulses on the echo signal will be cancelled out.

We claim:

1. A method of imaging a portion of a body placed in a static magnetic field by means of magnetic resonance, which method comprises:

a) generating MR signals in a region which is curved relative to isodynamic lines of the static magnetic field and which comprises the portion of the body, through the use of pulse sequences which comprise 2DRF or 3DRF pulses and temporary magnetic gradient fields for exciting the curved region, whereby at the same time magnetic resonance characteristics of the portion of the body are encoded in the MR signals, b) receiving and sampling the generated MR signals, and c) reconstructing an image of the portion of the body from values of the sampled MR signals.

2. A method as claimed in claim 1, further comprising:

a) repeatedly generating and sampling MR signals for a plurality of images of the portion to be imaged, magnetic resonance characteristics of the portion of the body being included in the MR signals in encoded form for consecutive images; and b) determining images by means of linear transforms of linear combinations of values of the sampled MR signals, or by means of linear combinations of linear transforms of the values of the sampled MR signals.

3. A method as claimed in claim 2, wherein a chosen scheme used for the encoding is a linear transformation scheme, and coefficients of the linear combinations are determined by the chosen scheme.

4. A method as claimed in claim 3, wherein the transformation scheme is a Fourier scheme, a Hadamard scheme or a wavelet scheme.

5. A method as claimed in claim 3, further comprising a stretching operation in which a linear axis is mapped along a stretched axis.

6. A method as claimed in claim 1, further comprising:

a) determining a correction mask from a shape of the curved portion of the sampled MR signal values; and b) correcting the intensity of an image of the curved portion by means of the correction mask.

7. A method as claimed in claim 1, further comprising:

a) subdividing the portion of the body into several sub-portions, b) repeatedly generating MR signals in the sub-portions by means of the RF pulses and temporary magnetic gradient fields, the magnetic resonance characteristics of each sub-portion being encoded in the MR signals in accordance with an encoding scheme, and c) reconstructing the image of the portion by means of an inverse transform of the chosen encoding scheme of the sampled MR signal values and one-dimensional Fourier transforms.

8. A method as claimed in claim 7, wherein the encoding scheme used is a linear transformation scheme.

9. A method as claimed in claim 8, wherein the linear transformation scheme is a Fourier scheme, Hadamard scheme or wavelet scheme.

10. A method as claimed in claim 1, wherein in the generation of MR signals a pulse sequence is used which also comprises RF pulses and temporary magnetic gradient fields for suppressing a contribution to the MR signals from a substance inherent in the body itself.

11. An MR device designed for making images of a portion of a body by means of nuclear spin resonance, which device is positioned in a substantially homogeneous static magnetic field and is provided with:

a) means for maintaining the static magnetic field, b) means for generating RF pulses, c) means for generating temporary magnetic gradient fields, d) a control unit for generating control signals for the means for generating the RF pulses and for the means for generating the temporary magnetic gradient fields, e) means for receiving, demodulating, and sampling the MR signals, f) a processing unit for processing the sampled MR signals, and the control unit is also designed for carrying out the following:

g) generation of MR signals by means of pulse sequences which comprise 2DRF or 3DRF pulses and temporary magnetic gradient fields for exciting a region which is curved relative to isodynamic lines of the static magnetic field and which comprises the portion of the body;

h) reception and sampling of MR signals; and i) reconstruction of an image of the portion of the body from values of the sampled MR signals.

12. A method as claimed in claim 4, further comprising a stretching operation in which a linear axis is mapped along a stretched axis.

13. A method as claimed in claim 2, further comprising:

a) determining a correction mask from a shape of the curved portion of the sampled MR signal values; and b) correcting the intensity of an image of the curved portion by means of the correction mask.

14. A method as claimed in claim 3, further comprising:
a) determining a correction mask from a shape of the curved portion of the sampled MR signal values; and
b) correcting the intensity of an image of the curved portion by means of the correction mask.

15. A method as claimed in claim 4, further comprising:
a) determining a correction mask from a shape of the curved portion of the sampled MR signal values; and
b) correcting the intensity of an image of the curved portion by means of the correction mask.

16. A method as claimed in claim 5, further comprising:
a) determining a correction mask from a shape of the curved portion of the sampled MR signal values; and
b) correcting the intensity of an image of the curved portion by means of the correction mask.

17. A method as claimed in claim 12, further comprising:
a) determining a correction mask from a shape of the curved portion of the sampled MR signal values; and
b) correcting the intensity of an image of the curved portion by means of the correction mask.

18. A method as claimed in claim 2, wherein in the generation of MR signals a pulse sequence is used which also comprises RF pulses and temporary magnetic gradient fields for suppressing a contribution to the MR signals from a substance inherent in the body itself.

19. A method as claimed in claim 3, wherein in the generation of MR signals a pulse sequence is used which also comprises RF pulses and temporary magnetic gradient fields for suppressing a contribution to the MR signals from a substance inherent in the body itself.

20. A method as claimed in claim 4, wherein in the generation of MR signals a pulse sequence is used which also comprises RF pulses and temporary magnetic gradient fields for suppressing a contribution to the MR signals from a substance inherent in the body itself.

* * * * *